(12) United States Patent
Zhang et al.

(10) Patent No.: US 10,373,911 B2
(45) Date of Patent: Aug. 6, 2019

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hai Yang Zhang, Shanghai (CN); Cheng Long Zhang, Shanghai (CN); Xin Jiang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTRING INTERNATIONAL (BEIJING) CORPORATION, Beijing (CN)

(*) Notice: Subject to any disclaimer, the term of this patent is extended or adjusted under 35 U.S.C. 154(b) by 0 days.

(21) Appl. No.: 15/945,883

(22) Filed: Apr. 5, 2018

(65) Prior Publication Data
US 2018/0294231 A1    Oct. 11, 2018

(30) Foreign Application Priority Data
Apr. 7, 2017  (CN) .......................... 2017 1 0223496

(51) Int. Cl.
*H01L 23/52* (2006.01)
*H01L 23/532* (2006.01)
(Continued)

(52) U.S. Cl.
CPC .. *H01L 23/53276* (2013.01); *H01L 21/28556* (2013.01); *H01L 21/31116* (2013.01);
(Continued)

(58) Field of Classification Search
CPC ......... H01L 21/76846; H01L 21/31144; H01L 21/76879; H01L 21/28556;
(Continued)

(56) References Cited

U.S. PATENT DOCUMENTS 7,585,768 B2 * 9/2009 Bu .................... H01L 21/288
257/E21.575
7,629,248 B2 * 12/2009 Kim .................. H01L 21/76805
257/E21.294

(Continued)

*Primary Examiner* — Luan C Thai
(74) *Attorney, Agent, or Firm* — Anova Law Group, PLLC (57) ABSTRACT

Semiconductor device and fabrication method are provided. The method includes: providing a base substrate with a bottom metallic layer in the base substrate and a dielectric layer on the base substrate; forming interconnect openings through the dielectric layer and exposing the bottom metallic layer, where each interconnect openings includes a contacting hole and a groove on the contacting hole; forming a first conducting layer in the contacting hole, where the first conducting layer is made of a material having a first conductivity along a direction from the bottom metallic layer to a top surface of the first conducting layer; and after forming the first conducting layer, forming a second conducting layer in the groove, where the second conducting layer is made of a material having a second conductivity along a direction parallel to the top surface of the base substrate and the first conductivity is greater than the second conductivity.

20 Claims, 5 Drawing Sheets

(51) Int. Cl.
*H01L 21/768* (2006.01)
*H01L 21/285* (2006.01)
*H01L 21/3213* (2006.01)
*H01L 23/528* (2006.01)
*H01L 21/311* (2006.01)
*H01L 21/321* (2006.01)
*H01L 23/522* (2006.01)

(52) U.S. Cl.
CPC .. *H01L 21/31144* (2013.01); *H01L 21/32135* (2013.01); *H01L 21/7684* (2013.01); *H01L 21/76802* (2013.01); *H01L 21/76846* (2013.01); *H01L 21/76876* (2013.01); *H01L 21/76879* (2013.01); *H01L 23/528* (2013.01); *H01L 23/53238* (2013.01); *H01L 21/3212* (2013.01); *H01L 23/5226* (2013.01); *H01L 2221/1089* (2013.01); *H01L 2221/1094* (2013.01)

(58) Field of Classification Search
CPC ........... H01L 21/31116; H01L 21/7684; H01L 21/32135; H01L 21/76876; H01L 23/528; H01L 23/53276
USPC .......................................................... 257/751
See application file for complete search history.

(56) References Cited

U.S. PATENT DOCUMENTS

| | | | |
|---|---|---|---|
| 7,923,819 B2* | 4/2011 | Ohmi | H01L 21/0212 257/632 |
| 8,399,772 B2* | 3/2013 | Gosset | B82Y 10/00 174/250 |
| 8,901,744 B2* | 12/2014 | Yang | H01L 23/53238 257/774 |
| 9,017,636 B2* | 4/2015 | Awano | B82Y 10/00 423/447.3 |
| 9,219,033 B2* | 12/2015 | Peng | H01L 23/5226 |
| 9,583,386 B2* | 2/2017 | Kolics | H01L 21/76807 |

* cited by examiner

SEMICONDUCTOR DEVICE AND FABRICATION METHOD THEREOF

CROSS-REFERENCES TO RELATED APPLICATION

This application claims the priority of Chinese Patent Application No. 201710223496.2, filed on Apr. 7, 2017, the content of which is incorporated herein by reference in its entirety.

TECHNICAL FIELD

The present disclosure generally relates to the field of semiconductor technologies and more particularly, relates to a semiconductor device and its fabrication method.

BACKGROUND

With continuous development of semiconductor integrated circuit technology, interconnect structures are often used for high-performance and high-density connections between semiconductor devices when critical dimensions of the semiconductor devices decrease to the sub-micrometer range. A parasitic resistance and a parasitic capacitance become easy to form in the interconnect structures. The subsequent parasitic effect can induce time delay in the transfer of metal wires. Significant increase in the resistance-capacitance (RC) delay due to a rapid increase in the length of the interconnects become a big challenge.

In the integration technology of the interconnects of the large-scale integrated circuits, two methods are used to overcome the parasitic effects of the interconnects. On one hand, a parasitic capacitance is proportional to a relative dielectric constant of insulating dielectrics in the interconnect layers. Conventional $SiO_2$ dielectric materials are substituted by low-K dielectric materials, especially ultra-low K dielectric materials, to meet requirements of the rapid development of chips. On the other hand, copper has a relatively low resistivity, an excellent anti-electromigration property, and a high reliability. Copper can reduce the interconnecting resistance of the metal and then reduce the total delay in the interconnections. Correspondingly, copper interconnects with lower resistance have substituted the conventional aluminium interconnections.

However, semiconductor devices formed by current technologies have poor performance. The disclosed devices and methods are directed to at least partially alleviate one or more problems set forth above and to solve other problems in the art.

SUMMARY

One aspect of the present disclosure provides a fabrication method of a semiconductor device. The method includes: providing a base substrate with a bottom metallic layer in the base substrate and a dielectric layer on the base substrate; forming interconnect openings through the dielectric layer and exposing the bottom metallic layer, where each interconnect openings includes a contacting hole and a groove on the contacting hole; forming a first conducting layer in the contacting hole, where the first conducting layer is made of a material having a first conductivity along a direction from the bottom metallic layer to a top surface of the first conducting layer; and after forming the first conducting layer, forming a second conducting layer in the groove, where the second conducting layer is made of material having a second conductivity along a direction parallel to the top surface of the base substrate and the first conductivity is greater than the second conductivity.

Another aspect of the present disclosure provides a semiconductor device. The semiconductor structure includes: a base substrate containing a bottom metallic layer inside the base substrate; a dielectric layer on the base substrate; interconnect openings through the dielectric layer and exposing the bottom metallic layer, where each interconnect opening include a contacting hole and a groove on the contacting hole; a first conducting layer in the contacting hole, where the first conducting layer is made of a material having a first conductivity along a direction from the bottom metallic layer to the top surface of the first conducting layer; and a second conducting layer in the groove, where the second conducting layer is made of a material having a second conductivity along a direction parallel to the top surface of the base substrate and the first conductivity is greater than the second conductivity.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIGS. 2-13 illustrate semiconductor structures corresponding to certain stages for forming an exemplary semiconductor device according to various disclosed embodiments of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
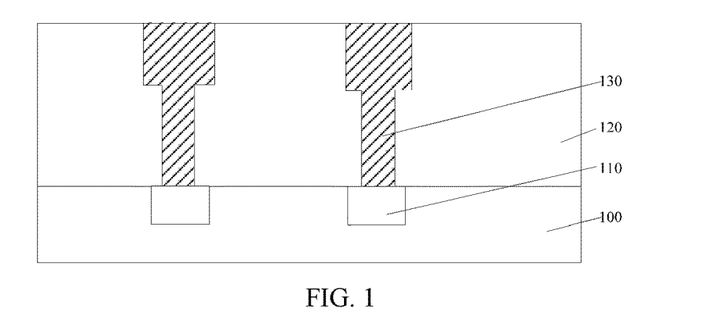
FIG. 1 illustrates a semiconductor device.

FIG. 1 illustrates a semiconductor device. The semiconductor device includes: a base substrate 100 with a bottom metallic layer 110 in the base substrate 100; a dielectric layer 120 on the base substrate 100; interconnecting openings through the dielectric layer 120 and exposing the bottom metallic layer; and a conducting layer 130 in the interconnecting openings. The interconnecting openings include contacting hole and groove on the contacting hole.

The conducting layer 130 in the contacting hole is used to electrically connect the bottom metallic layer 110 and the conducting layer in the groove. The conducting layer 130 in the contacting hole conducts electrical current parallel to a direction from the bottom metallic layer 110 to a top surface of the conducting layer 130. Correspondingly, a cross section area through which the currents in the conducting layer 130 in the contacting hole flows is smaller than a cross-section area through which the currents in the conducting layer 130 in the groove flows. Subsequently, with the continuous decrease of critical dimensions of the semiconductor devices, the conducting layer 130 in the contacting hole has a large current density when conducting the electrical currents, and then has a serious current crowding effect.

The present disclosure provides a semiconductor device and its fabricating method. The method includes: providing a base substrate with a bottom metallic layer in the base substrate and a dielectric layer on the base substrate; forming interconnect openings through the dielectric layer and exposing the bottom metallic layer, where each interconnect openings includes a contacting hole and a groove on the contacting hole; forming a first conducting layer in the contacting hole, where the first conducting layer is made of a material having a first conductivity along a direction from the bottom metallic layer to a top surface of the first conducting layer; and after forming the first conducting layer, forming a second conducting layer in the groove, where the second conducting layer is made of material having a second conductivity along a direction parallel to the top surface of the base substrate and the first conductivity is greater than the second conductivity.

The first conducting layer may be formed in the contacting hole to connect the bottom metallic layer and the second conducting layer. The first conducting layer may conduct electrical currents parallel to a direction from the bottom metallic layer to a top surface of the first conducting layer. The second conducting layer may be formed in the groove and may conduct electrical currents along a direction parallel to a top surface of the base substrate. The material of the first conducting layer along a direction from the bottom metallic layer to the top surface of the first conducting layer may have a first conductivity, and the material of the second conducting layer along a direction parallel to the top surface of the base substrate may have the second conductivity. The first conductivity may be greater than the second conductivity. Correspondingly, the first conducting layer may have a small current density when conducting the electrical current, and the current crowding effect in the first conducting layer may be alleviated.

Figure 11:
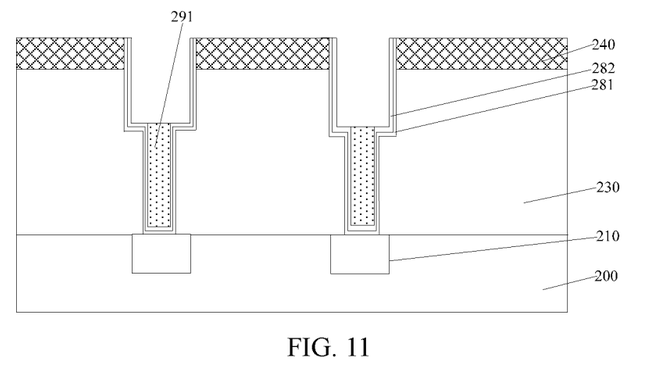
Figure 12:
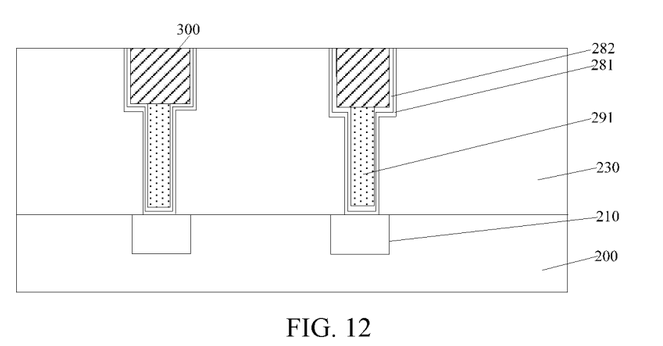
Figure 13:
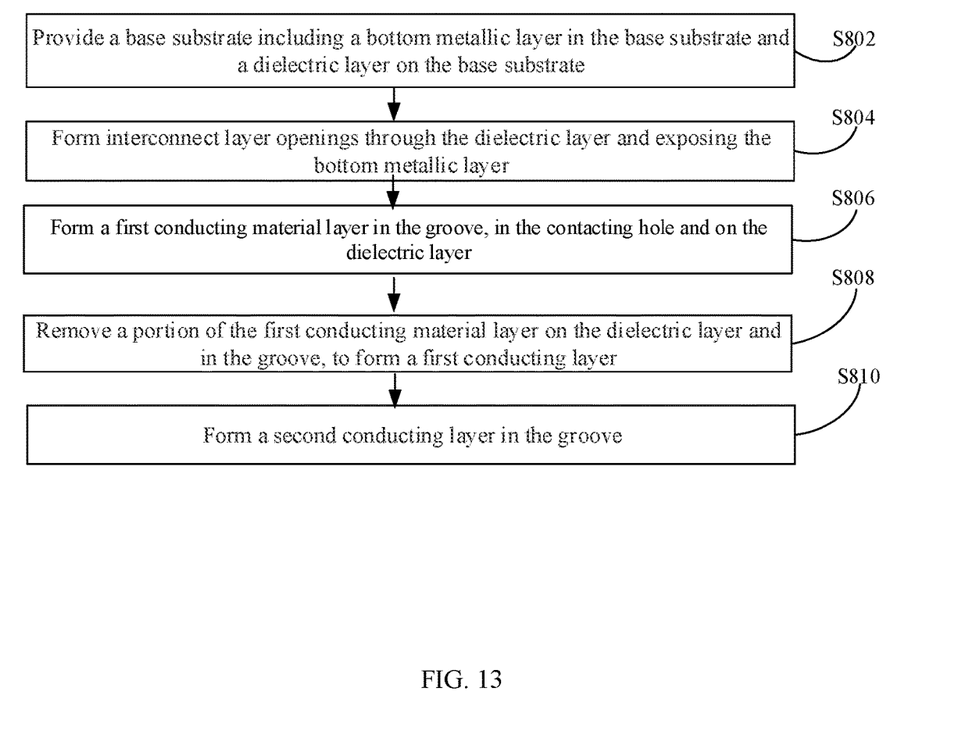
FIG. 13 illustrates an exemplary method for forming a semiconductor device according to various disclosed embodiments of the present disclosure.

FIGS. 2-12 illustrate semiconductor structures corresponding to certain stages for forming an exemplary semiconductor device according to various disclosed embodiments of the present disclosure; and FIG. 13 illustrates an exemplary method for forming a semiconductor device according to various disclosed embodiments of the present disclosure.

Figure 2:
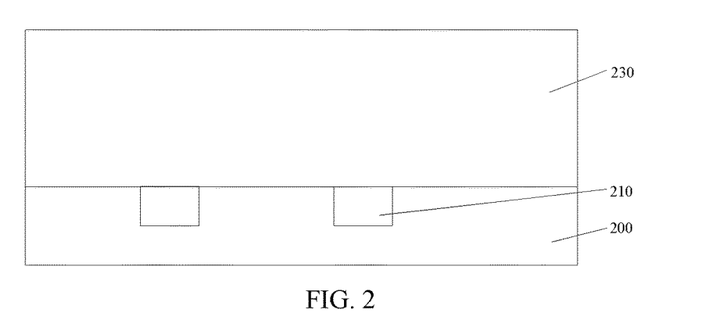

Referring to FIG. 2, a base substrate 200 including the bottom metallic layer 210 in the base substrate and a dielectric layer 230 on the base substrate, may be provided (in Step S802 in FIG. 13).

The base substrate 200 may include a semiconductor substrate and a metallic dielectric layer on the semiconductor substrate. The bottom metallic layer 210 may be inside the metallic dielectric layer.

The semiconductor substrate may include various semiconductor structures. The semiconductor structure may be a PMOS transistor, an NMOS transistor, a CMOS transistor, a capacitor, a resistor or an inductor.

The bottom metallic layer 210 may be used to connect the semiconductor structure in the semiconductor substrate and the first conducting layer to be formed.

The bottom metallic layer 210 may be made of copper, copper-aluminium alloy or other conducting materials.

The dielectric layer 230 may be made of a low-K dielectric material (a dielectric material with a relative dielectric constant greater than or equal to 2.6, but smaller than 3.9) such as SIGH, SiCOH, $SiO_2$ doped with F (FSO), $SiO_2$ doped with B (BSO), $SiO_2$ doped with P (PSG), $SiO_2$ doped with P and B (BPSG), HSQ $((HSiO_{1.5})_n)$, or MSQ $((CH_3SiO_{1.5})_n)$. The dielectric layer 230 also may be made of an ultra-low-K dielectric material (a dielectric material with a relative dielectric constant smaller than 2.6), such as SiCOH.

Subsequently, the interconnect openings through the dielectric layer may be formed to expose the bottom metallic layer. Each interconnect opening may include a contacting hole and a groove on the contacting hole FIGS. 3-8 illustrate the process to form the interconnect openings (in Step S804 in FIG. 13).

Figure 3:
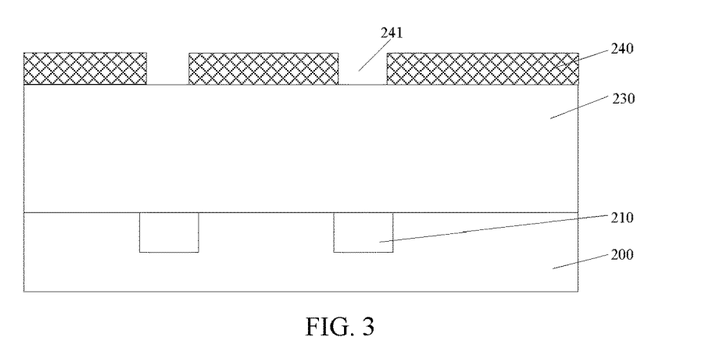

Referring to FIG. 3, a mask layer 240 with groove-patterned openings 241 may be formed on the dielectric layer 230 (in Step S804 in FIG. 13).

Figure 4:
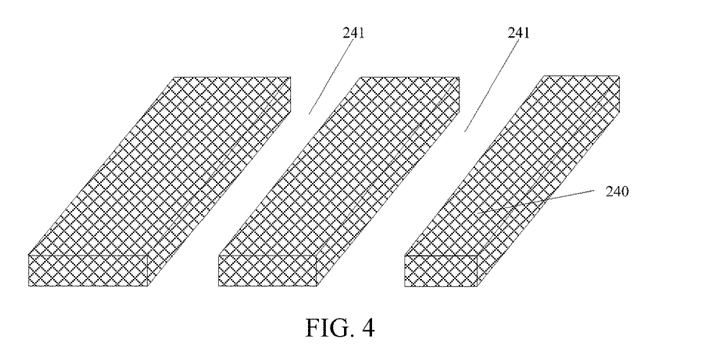

FIG. 4 illustrates a three-dimensional structure of the mask layer 240. The mask layer 240 may have a single-layer or a multi-layer structure, and may be made of TiN or TaN. The mask layer 240 may have one or more discrete groove-patterned openings 241. The groove-patterned openings 241 may define position and shape of the groove to be formed. For illustration purposes, the present disclosure is described using an example that has two groove-patterned openings 241, although any suitable quantity of groove-patterned openings 241 may be encompassed according to various embodiments of the present disclosure.

Figure 5:
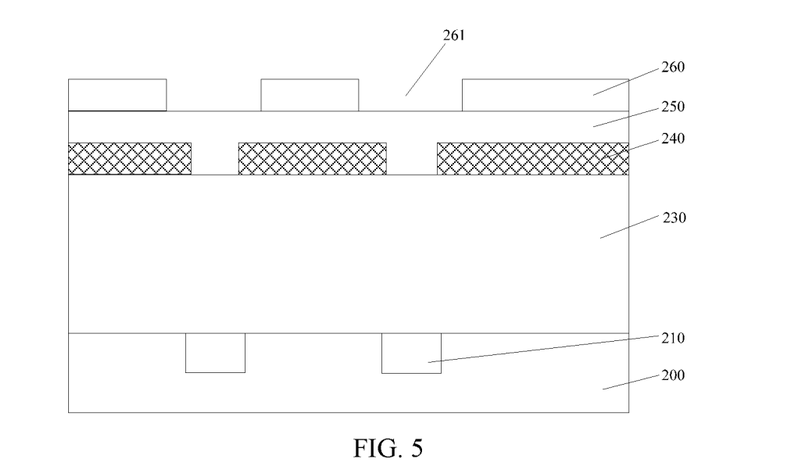

Referring to FIG. 5 based on FIG. 3, a planarizing layer 250 may be formed to cover the mask layer 240 and the groove-patterned openings 241.

The planarizing layer 250 may be made of organic coating materials, anti-reflection coating materials or amorphous carbon. The planarizing layer 250 may be formed by a spin coating process or a chemical vapour deposition process.

Also referring to FIG. 5, a photoresist layer 260 with contacting-hole-patterned openings 261 may be formed on the planarizing layer 250. Each contacting-hole-patterned opening 261 may be formed above one groove-patterned opening 241.

The photoresist layer 260 may be made of a photoresist.

Figure 6:
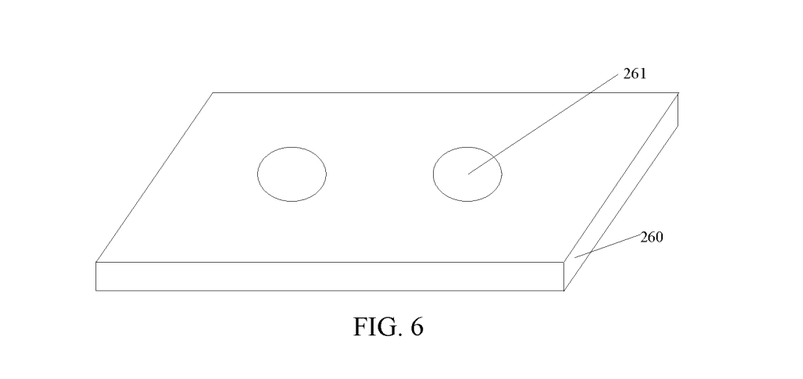

FIG. 6 illustrates a three-dimensional structure of the photoresist layer 260. The photoresist layer 260 may have contacting-hole-patterned openings 261. The contacting-hole-pattern openings 261 may define positions and shape of the contacting hole to be formed.

In one embodiment, the contacting-hole-patterned openings 261 may have an aperture greater than a width of the groove-patterned openings 241, and then a width of the contacting hole to be formed may be determined by the width of the groove-patterned openings 241. The width of the contacting hole may refer to a size of the contacting hole along a direction parallel to the widthwise direction of the groove-patterned openings 241, and the length of the contacting hole may refer to a size along a direction parallel to a top surface of the base substrate but perpendicular to the widthwise direction of the groove-patterned openings 241. Correspondingly, the width of the contacting hole to be formed may completely utilize the width of the groove-patterned openings 241, which is favourable for subsequently filling the contacting hole with the conducting layer.

In other embodiments, the contacting-hole-patterned openings 261 may have an aperture smaller than or equal to the width of the groove-patterned openings 241.

Figure 7:
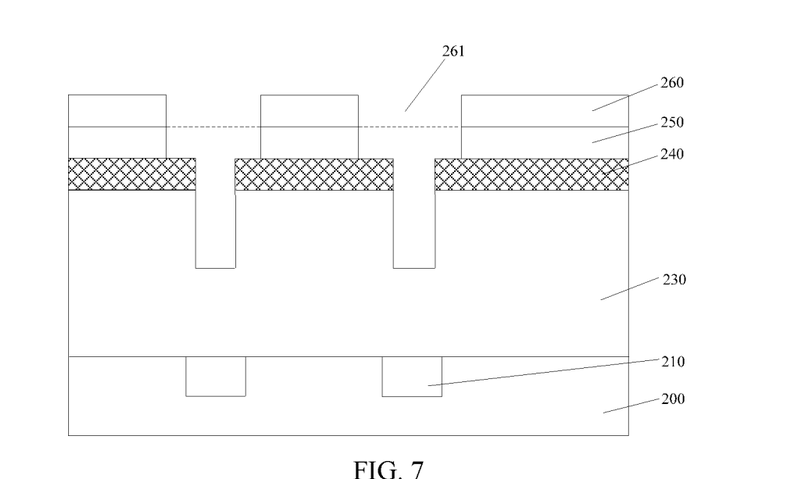

Referring to FIG. 7 based on FIG. 5, a partial thickness of the dielectric layer 230 may be etched away using the photoresist layer 260 and the mask layer 240 as a mask, to form an initial contacting hole in the dielectric layer 230.

In one embodiment, before removing a partial thickness of the dielectric layer 230, the planarizing layer 250 may be etched along the contacting-hole-pattern holes 261, to expose a top surface of the dielectric layer 230.

An anisotropic dry etching process (such as an anisotropic plasma etching process or a reactive plasma etching process) may be used to remove a partial thickness of the dielectric layer 230 using the photoresist layer 260 and the mask layer 240 as a mask, to form the initial contacting hole in the dielectric layer 230.

In a subsequent etching process to etch the dielectric layer 230 using the ask layer 240 as a mask, a portion of the dielectric layer 230 on a bottom of the initial contacting hole may be etched away along the initial contacting hole.

Figure 8:
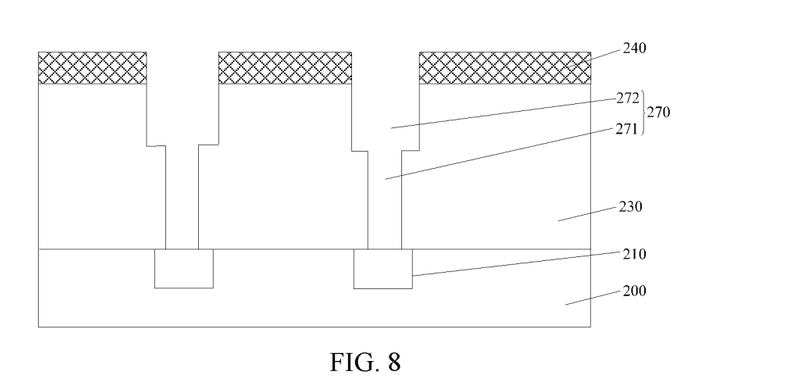

Referring to FIG. 8, the photoresist layer 260 and the planarizing layer 250 may be removed. After removing the photoresist layer 260 and the planarizing layer 250, the dielectric layer 230 may be etched using the mask layer 240 as a mask until exposing the top surface of the bottom metallic layer 210, to form the interconnect openings 270.

Each interconnect opening 270 may include a contacting hole 271 and a groove 272 on the contacting hole 271.

The contacting hole 271 may have an extending direction parallel to a direction from the bottom metallic layer 210 to the dielectric layer 230, and the groove 272 may have an extending direction parallel to the top surface of the base substrate 200.

Subsequently, the first conducting layer may be formed in the contacting hole 271, and the first conducting layer may be made of a material having the first conductivity along a direction from the bottom metallic layer 210 to the top surface of the first conducting layer.

The process to form the first conducting layer may include: forming a first conducting material layer in the groove 272, in the contacting hole 271, and on the dielectric layer 230; removing a first portion of the conducting material layer on the dielectric layer 230; and, after removing the first portion of the conducting material layer on the dielectric layer 230, removing a second portion of the conducting material layer in the groove 272 to form the first conducting layer.

Figure 9:
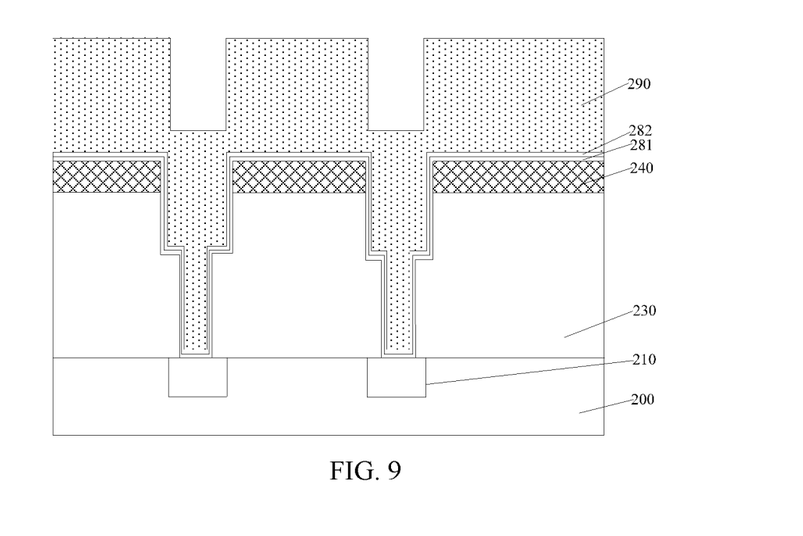

Referring to FIG. 9, the first conducting material layer 290 may be formed in the groove 272, in the contacting hole 271, and on the dielectric layer 230 (in Step S806 in FIG. 13).

In one embodiment, the first conducting material layer 290 may be made of carbon nanotubes, and the carbon nanotubes may have an extending direction parallel to a direction from the bottom metallic layer 210 to a top surface of the first conducting material layer 290.

The first conducting material layer 290 may be formed by a laser ablation method, a catalytic chemical vapour deposition process (CCVD) or an electrical arc process.

For illustration purposes, the present disclosure is described using the first conducting material layer 290 formed by the catalytic vapour deposition process as an example.

Before forming the first conducting material layer 290, a catalyst layer may be formed on inner sidewalls of the groove 272, on sidewalls of the contacting hole 271, and on the dielectric layer 230. Correspondingly, the first conducting material layer 290 may be formed on a surface of the catalyst layer.

The catalytic chemical vapour deposition process may use transition metals (such as Fe, Co, Ni, etc.) as a material of the catalyst layer. Then a carbon-source gas may be decomposed to generate free carbon atoms at about 700° C. to about 1200° C. The free carbon atoms may deposit on the catalyst layer to form the first conducting layer 290 made of carbon nanotubes.

In one embodiment, the catalyst layer may be made of cobalt nanoparticles, iron nanoparticles, nickel nanoparticles, or a combination thereof, since they have a good catalytic performance and a high catalytic efficiency.

The catalyst layer may be formed by a molecular beam epitaxy process or a sputtering deposition process.

In one embodiment, before forming the catalyst layer, a catalytic matrix layer 282 may be formed on the inner sidewalls of the groove 272, on the inner sidewalk of the contacting hole 271, and on the dielectric layer 230. Correspondingly, the catalyst layer may be formed on a surface of the catalytic matrix layer 282, after forming the catalyst layer.

The catalytic matrix layer 282 may be made of a material including copper.

The catalytic matrix layer 282 may optimize the growth of the catalyst layer to make the catalyst layer more homogeneous.

The process for forming the catalytic matrix layer 282 may include: forming an initial catalytic matrix layer on the inner sidewalk of the groove 272, on the inner sidewalls of the contacting hole 271, and on the dielectric layer 230; and annealing the initial catalytic matrix layer to form the catalytic matrix layer 282.

The initial catalytic matrix layer may be made of Cu3N when the catalytic matrix layer is made of copper.

In various embodiments, the initial catalytic matrix layer may be formed by an atomic layer deposition process or a sputtering deposition process.

In one embodiment, a barrier seed structure 281 may be formed on the inner sidewalk of the groove 272, on the inner sidewalls of the contacting hole 271, and on the dielectric layer 230. Correspondingly, the catalytic matrix layer 282 may be located on a surface of the barrier seed structure 281 after forming the catalytic matrix layer 282.

The barrier seed structure 281 may block a diffusion of the catalytic matrix layer 282 and the second conducting layer to be formed, and may be used as a seed layer for forming the catalytic matrix layer 282.

The barrier seed structure 281 may include a first barrier seed layer on the inner sidewalls of the groove 272 and on the inner sidewalls of the contacting hole 271, and a second barrier seed layer on a surface of the first barrier seed layer. The second barrier seed layer may be between the first barrier seed layer and the catalytic matrix layer 282.

The first barrier seed layer may be made of Ta, and the second barrier seed layer may be made of TaN. Or the first barrier seed layer may be made of Ti, and the second barrier seed layer may be made of TiN.

In other embodiments, the barrier seed structure may be not formed.

In me embodiment, the mask layer 240 may be preserved before forming the first conducting material layer 290, the catalyst layer, the catalytic matrix layer 282 and the barrier seed structure 281. The mask layer 240 may protect the top surface of the dielectric layer 230 in a subsequent planarizing process or etching process. Correspondingly, the first conducting material layer 290, the catalyst layer, the catalytic matrix layer 282 and the barrier seed structure 281, may be located on the mask layer 240.

In other embodiments, the mask layer 240 may be removed before forming the first conducting material layer 290, the catalyst layer, the catalytic matrix layer 282 and the barrier seed structure 281.

Figure 10:
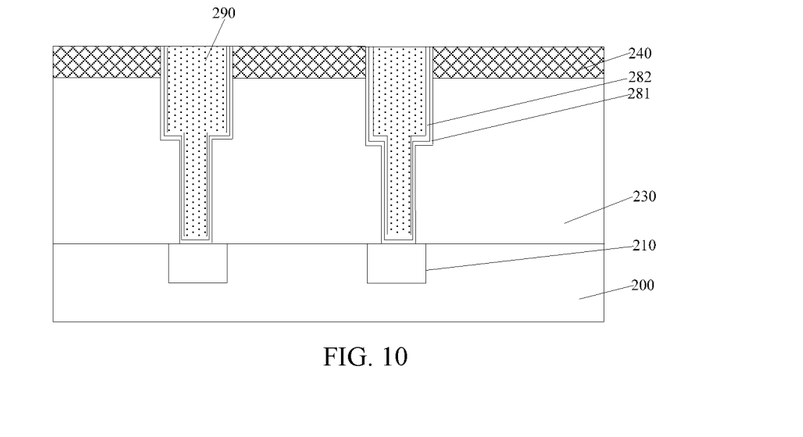

Referring to FIG. 10, a first portion of the first conducting material layer 290 on the dielectric layer 230 may be removed.

The first portion of the first conducting material layer 290 on the dielectric layer 230 may be removed by a planarizing process.

In one embodiment, when removing the first portion of the first conducting material layer 290 on the dielectric layer 230, a portion of the catalyst layer, a portion of the catalytic matrix layer 282, and a portion of the barrier seed structure 281 on the dielectric layer 230 may be removed.

In one embodiment, the first conducting material layer 290, the catalyst layer, the catalytic matrix layer 282 and the barrier seed structure 281 may be planarized by a planarizing process to expose the top surface of the mask layer 240.

Referring to FIG. 11, after removing the first portion of the first conducting material layer 290 on the dielectric layer 230, a second portion of the first conducting material layer 290 in the groove may be removed to form the first conducting layer 291 (in Step S808 in FIG. 13).

The second portion of the first conducting material layer 290 in the groove may be removed by an etching process.

In one embodiment, the second portion of the first conducting material layer 290 in the groove may be removed by a dry etching process using a gas including one or any combination of $O_2$, $CO_2$, $CO$ and $SO_2$.

In one embodiment, the first conducting layer 291 may be made of carbon nanotubes, and the carbon nanotubes may have an extending direction parallel to a direction from the bottom metallic layer 210 to a top surface of the first conducting layer 291.

The first conducting layer 291 may conduct electrical currents parallel to a direction from parallel to a direction from the bottom metallic layer 210 to the top surface of the first conducting layer 291.

The first conducting layer 291 may be made of a material having a first conductivity along the direction from the bottom metallic layer 210 to the top surface of the first conducting layer 291.

Referring to FIG. 12, after forming the first conducting layer 291, the second conducting layer 300 may be formed in the groove 272 (in Step S810 in FIG. 13). The second conducting layer 300 may be made of a material having a second conductivity along a direction parallel to the top surface of the base substrate 200 and the first conductivity may be greater than the second conductivity.

The second conducting aver 300 may be made of a metal including as copper.

The second conducting layer 300 may conduct electrical currents along a direction parallel to the top surface of the base substrate 200.

The process for forming the second conducting layer 300 may include: forming a second conducting material layer (not shown in the figure) in the groove 272 and on the dielectric layer 230; and removing a portion of the second conducting material layer on the dielectric layer 230 to form the second conducting layer 300.

In one embodiment, the portion of the second conducting material layer on the dielectric layer 230 may be removed by a planarizing process such as a chemical mechanical planarizing process. The mask layer 240 may be removed when removing the portion of the second conducting material layer on the dielectric layer 230.

In one embodiment, the cross-section area through which the electrical currents flow in the first conducting layer 291 may be smaller than the cross-section area through which the electrical currents flow in the second conducting layer 300.

This disclosure embodiment also provides a semiconductor device using the above method, as shown in FIG. 12, including: a base substrate 200 including a bottom metallic layer 210 in the base substrate 200; a dielectric layer 230 on the base substrate 200; interconnect openings 250 through the dielectric layer 230 (referring to FIG. 8) and exposing the bottom metallic layer 210, where each interconnect openings 250 may include a contacting hole 271 and a groove 272 on the contacting hole 271; a first conducting layer 291 in the contacting hole 271, where the first conducting layer 291 may be made of a material having a first conductivity along a direction from the bottom metallic layer 210 to a top surface of the first conducting layer 291; a second conducting layer 300 in the groove 272, where the second conducting layer 300 may be made of a material having a second conductivity along a direction parallel to the top surface of the base substrate 200 and the first conductivity is greater than the second conductivity.

The first conducting layer 291 may be made of carbon nanotubes and the carbon nanotubes may have an extending direction parallel to a direction from the bottom metallic layer 210 to the top surface of the first conducting layer 291. The second conducting layer 300 may be made of metals.

The semiconductor device may further include a barrier seed structure 281. The barrier seed structure 281 may be between the first conducting layer 291 and the dielectric layer 230, and between the second conducting layer 300 and the dielectric layer 230.

The barrier seed structure 291 may include a first barrier seed layer on the inner sidewalls of the groove 272 and on the inner sidewalls of the contacting hole 271, and a second barrier seed layer on the surface of the first barrier seed layer. The second barrier seed layer may be between the first barrier seed layer and the first conducting layer 291, and between the first barrier seed layer and the second conducting layer 300.

In the present disclosure, the first conducting layer may be formed in the contacting hole to connect the bottom metallic layer and the second conducting layer. The first conducting layer may conduct electrical currents parallel to a direction from the bottom metallic layer to a top surface of the first conducting layer. The second conducting layer may be formed in the groove and may conduct electrical currents along a direction parallel to a top surface of the base substrate. The material of the first conducting layer along a direction from the bottom metallic layer to the top surface of the first conducting layer may have a first conductivity, and the material of the second conducting layer along a direction parallel to the top surface of the base substrate may have the second conductivity. The first conductivity may be greater than the second conductivity. Correspondingly, the first conducting layer may have a small current density when conducting the electrical current, and the current crowding effect in the first conducting layer may be alleviated.

Further, the first conducting layer may be made of carbon nanotubes and the carbon nanotubes may have an extending direction parallel to a direction from the bottom metallic layer to the top surface of the first conducting layer. Since the carbon nanotubes have high conductivity along the extending direction, the first conductivity in the first conducting layer may be increased further and the current crowding effect in the first conducting layer may be alleviated further.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a semiconductor device, comprising:
    providing a base substrate with a bottom metallic layer in the base substrate;
    providing a dielectric layer on the base substrate;
    forming interconnect openings, through the dielectric layer, and exposing the bottom metallic layer, each interconnect opening including a contacting hole and a groove on the contacting hole;
    forming a barrier seed structure on the inner sidewalls of the groove, on the inner sidewalls of the contacting hole, and on the dielectric layer, and forming a catalytic matrix layer on top of the barrier seed structure;
    forming a first conducting layer in the contacting hole, wherein the first conducting layer is made of a material having a first conductivity along a direction from the bottom metallic layer to a top surface of the first conducting layer;
    after forming the first conducting layer, forming a second conducting layer in the groove, wherein the second conducting layer is made of a material having a second conductivity along a direction parallel to a top surface of the base substrate, and the first conductivity is greater than the second conductivity, wherein the first conducting layer and the second conducting layer are isolated from the dielectric layer by the barrier seed structure and the catalytic matrix layer.

2. The fabrication method according to claim 1, wherein:
    the first conducting layer is made of carbon nanotubes; and
    the carbon nanotubes have an extending direction parallel to the direction from the bottom metallic layer to the top surface of the first conducting layer.

3. A fabrication method of a semiconductor device, comprising:
    providing a base substrate with a bottom metallic layer in the base substrate;
    providing a dielectric layer on the base substrate;
    forming interconnect openings, through the dielectric layer, and exposing the bottom metallic layer, each interconnect opening including a contacting hole and a groove on the contacting hole;
    forming a first conducting layer in the contacting hole, wherein the first conducting layer is made of a material having a first conductivity along a direction from the bottom metallic layer to a top surface of the first conducting layer,
    wherein forming the first conducting layer includes:
        forming a first conducting material layer in the groove, in the contacting hole and on the dielectric layer;
        removing a first portion of the first conducting material layer on the dielectric layer; and
        removing a second portion of the first conducting material layer from the groove to form the first conducting layers;
    after forming the first conducting layer, forming a second conducting layer in the groove, wherein the second conducting layer is made of a material having a second conductivity along a direction parallel to a top surface of the base substrate, and the first conductivity is greater than the second conductivity.

4. The fabrication method according to claim 3, wherein:
    the first conducting layer is formed by a catalytic chemical vapour deposition method, the method further including:
    before performing the catalytic chemical vapour deposition method, forming a catalyst layer on inner sidewalls of the groove, on inner sidewalls of the contacting hole, and on the dielectric layer, wherein the first conducting layer is then formed on a surface of the catalyst layer; and
    when removing the first portion of the conducting material layer from the dielectric layer, removing a portion of the catalyst layer from the dielectric layer.

5. The fabrication method according to claim 4, wherein the catalyst layer is made of cobalt nanoparticles, iron nanoparticles, nickel nanoparticles or a combination thereof.

6. The fabrication method according to claim 4, further including:
    before forming the catalyst layer, forming a catalytic matrix layer on the inner sidewalls of the groove, on the inner sidewalls of the contacting hole, and on the dielectric layer, followed by forming the catalyst layer on a surface of the catalytic matrix layer; and
    when removing the first portion of the conducting material layer from the dielectric layer, removing a portion of the catalytic matrix layer and the portion of the catalyst layer from the dielectric layer.

7. The fabrication method according to claim 6, wherein the catalytic matrix layer is made of a material including copper.

8. The fabrication method according to claim 6, wherein forming the catalytic matrix layer includes:
    forming an initial catalytic matrix layer on the inner sidewalls of the groove, on the inner sidewalls of the contacting hole, and on the dielectric layer; and
    annealing the initial catalytic matrix layer to form the catalytic matrix layer.

9. The fabrication method according to claim 8, wherein the initial catalytic matrix layer is made of $Cu_3N$ when the matrix layer is made of copper.

10. The fabrication method according to claim 8, wherein the initial catalytic matrix layer is formed by an atomic layer deposition process.

11. The fabrication method according to claim 6, further including:
    before forming the catalytic matrix layer, forming a barrier seed structure on the inner sidewalls of the groove, on the inner sidewalls of the contacting hole, and on the dielectric layer, followed by forming the catalytic matrix layer on the barrier seed structure; and
    when removing the first portion of the conducting material layer from the dielectric layer, removing the portion of the catalytic matrix layer, the portion of the catalyst layer and a portion of the barrier seed structure on the dielectric layer.

12. The fabrication method according to claim 11, wherein the barrier seed structure include:
    a first barrier seed layer on the inner sidewalls of the groove and contacting hole; and
    a second barrier seed layer on a surface of the first barrier seed layer, wherein the second barrier seed layer is between the first barrier seed layer and the catalytic matrix layer.

13. The fabrication method according to claim 12, wherein:
the first barrier seed layer is made of tantalum and the second barrier seed layer is made of TaN, or
the first barrier seed layer is made of titanium and the second barrier seed layer is made of TiN.

14. The fabrication method according to claim 3, wherein
the first portion of the first conducting material layer is removed from the dielectric layer by a planarizing process; and
the second portion of the first conducting material layer is removed from the groove by an etching process.

15. The fabrication method according to claim 14, wherein the etching process is a dry etching process using a gas including $O_2$, $CO_2$, CO, $SO_2$ or a combination thereof.

16. The fabrication method according to claim 1, wherein the second conducting layer is made of one or more metals.

17. A semiconductor device, comprising:
a base substrate containing a bottom metallic layer therein;
a dielectric layer on the base substrate, wherein interconnect openings are through the dielectric layer to expose the bottom metallic layer, each interconnect opening including a contacting hole and a groove on the contacting hole;
a barrier seed structure on the inner sidewalls of the groove, on the inner sidewalls of the contacting hole, and on the dielectric layer;
a catalytic matrix layer on top of the barrier seed structure;
a first conducting layer in the contacting hole, wherein the first conducting layer is made of a material having a first conductivity along a direction from the bottom metallic layer to a top surface of the first conducting layer; and
a second conducting layer in the groove, wherein the second conducting layer is made of a material having a second conductivity along a direction parallel to a top surface of the base substrate, and the first conductivity is greater than the second conductivity, wherein the first conducting layer and the second conducting layer are isolated from the dielectric layer by the barrier seed structure and the catalytic matrix layer.

18. The semiconductor device according to claim 17, wherein the first conducting layer is made of carbon nanotubes and the carbon nanotubes have an extending direction parallel to the direction from the bottom metallic layer to the top surface of the first conducting layer.

19. The semiconductor device according to claim 17, further including the barrier seed structure between the first conducting layer and the dielectric layer, and between the second conducting layer and the dielectric layer.

20. The semiconductor device according to claim 19, wherein the barrier seed structure includes:
a first barrier seed layer on the inner sidewalls of the groove and contacting hole; and
a second barrier seed layer on the first barrier seed layer, between the first barrier seed layer and the first conducting layer, and between the first barrier seed layer and the second conducting layer.

* * * * *